(12) United States Patent
De Bosscher

(10) Patent No.: US 9,394,603 B2
(45) Date of Patent: Jul. 19, 2016

(54) SOFT SPUTTERING MAGNETRON SYSTEM

(75) Inventor: Wilmert De Bosscher, Drongen (BE)

(73) Assignee: Soleras Advanced Coatings bvba, Deinze (BE)

( * ) Notice: Subject to any disclaimer, the term of this patent is extended or adjusted under 35 U.S.C. 154(b) by 266 days.

(21) Appl. No.: 13/885,905

(22) PCT Filed: Nov. 17, 2011

(86) PCT No.: PCT/EP2011/070357
§ 371 (c)(1),
(2), (4) Date: May 16, 2013

(87) PCT Pub. No.: WO2012/066079
PCT Pub. Date: May 24, 2012

(65) Prior Publication Data
US 2013/0228452 A1    Sep. 5, 2013

(30) Foreign Application Priority Data
Nov. 17, 2010  (EP) .................................... 10191612

(51) Int. Cl.
C23C 14/34 (2006.01)
C23C 14/35 (2006.01)
H01J 37/34 (2006.01)

(52) U.S. Cl.
CPC ............. *C23C 14/352* (2013.01); *H01J 37/342* (2013.01); *H01J 37/3405* (2013.01); *H01J 37/3417* (2013.01)

(58) Field of Classification Search
CPC  C23C 14/352; H01J 37/3405; H01J 37/3417; H01J 37/342
USPC .............. 204/298.21, 298.22, 298.26, 192.12
See application file for complete search history.

(56) References Cited

U.S. PATENT DOCUMENTS 5,100,527 A * 3/1992 Stevenson et al. ....... 204/298.22
6,365,010 B1 4/2002 Hollars
(Continued)

FOREIGN PATENT DOCUMENTS

DE      41 17 367 A1    12/1992
JP      2002529600 A    9/2002
(Continued)

OTHER PUBLICATIONS

International Search Report issued in PCT/EP2011/070357, Apr. 12, 2012.

*Primary Examiner* — Rodney McDonald
(74) *Attorney, Agent, or Firm* — Workman Nydegger

(57) ABSTRACT

A sputtering method and apparatus having at least one set of dual rotatable cylindrical sputtering targets mounted in a vacuum chamber. Magnet assemblies in hollow target cylinders provide erosion zones running long the parallel sides of a racetrack that act as target flux sources towards a substrate. These parallel erosion zones have a highly concentrated plasma density for rapid sputtering of the target and any reactive material. Features include the angular distance between normals to adjacent parallel erosion zones, the angle greater than 45° subtended at the center of the cylindrical target, placement of the substrate with respect to the targets, and pointing angles (orientation or tilt) of the racetracks toward the substrate and/or each other. These parameters form a relatively wide and efficient constant flux deposition region at the substrate, and allows for high deposition rates at constant reactive gas partial pressures with substantially uniform film stoichiometry and thickness.

17 Claims, 5 Drawing Sheets

(56) References Cited

U.S. PATENT DOCUMENTS

| | | | |
|---|---|---|---|
| 2005/0109616 A1* | 5/2005 | Ohta et al. | 204/298.18 |
| 2007/0089983 A1 | 4/2007 | Plaisted et al. | |
| 2009/0283400 A1 | 11/2009 | Stowell et al. | |
| 2010/0187104 A1 | 7/2010 | Tamagaki | |

FOREIGN PATENT DOCUMENTS

| | | | |
|---|---|---|---|
| WO | WO 92/01081 A1 * | 1/1992 | |
| WO | 0028104 A1 | 5/2000 | |

* cited by examiner

| | | | |
|---|---|---|---|
| RT Angle | ° | | 54 |
| Tilting outer magnetrons | ° | | 6 |
| Target diameter | mm | | 150 |
| Target-target spacing | mm | | 190 |
| Number of magnetron sets | dual | | 2 |
| Uniform width | mm | | 400 |
| Power level per magnetron | 1 | | 100% |
| | 2 | | 100% |
| Target-substrate spacing | 1 | | 149 |
| | 2 | | 121 |
| Uniformity (relative) | min | | 99.9% |
| | max | | 100.1% |
| | P2P | | 0.2% |

SOFT SPUTTERING MAGNETRON SYSTEM

The present invention relates generally to vacuum sputtering systems and processes, and more particularly to sputtering machines and processes utilizing magnetrons and cylindrical targets operated in a manner which produce uniform coatings on a substrate.

TECHNICAL BACKGROUND

DC, AC or RF Sputtering using a magnetron and planar and cylindrical targets is known. On a planar or cylindrical target a plasma "racetrack" is formed and the target erodes to form an erosion region which follows the shape of the racetrack while the eroded material is deposited onto a substrate.

With a cylindrical target, the target material is a tube, which is rotated around its cylindrical axis. On the inside of the tube magnets are arranged that that are typically stationary with respect to a substrate to be coated.

Reactive magnetron sputtering is also known e.g. for the deposition of insulating (e.g. oxide or nitride of a metal) and semiconducting coatings. In reactive sputtering, the inert working gas is usually argon and the added reactive gas is often oxygen and/or nitrogen. The coating of dielectric materials can be accomplished by RF sputtering of the dielectric material itself used as the target but the deposition rates are very low. DC or AC reactive magnetron sputtering of insulating films can have higher deposition rates and lower costs, but there is a need to improve the quality of the deposited insulating metal oxides and nitrides, e.g. their variation in thickness and/or the chemical variability of the coating. Process control for reactively depositing insulating films at high rate traditionally has been difficult. Usually the substrate is moved continuously underneath the magnetron, in a direction perpendicular to the longitudinal axis of the cylindrical target. The instantaneous deposition rate over the deposition region is not always constant and the resulting film does not have a uniform stoichiometry.

U.S. Pat. No. 4,466,877 McKelvey describes a pair of rotatable cylindrical magnetrons mounted horizontally and spaced in a parallel relationship to each other such that the sputtered flux is directed inwardly and downwardly from each is focused on the same region of the substrate. U.S. Pat. No. 6,365,010 describes a magnetron system for eroding and depositing target material on a substrate, having a first and a second rotatable cylindrical tubular target, wherein the second rotatable cylindrical tubular target is positioned relative to the first target such that axes of the first and second targets are parallel to each other and the outside surfaces of the first and second cylindrical tubular targets are in close proximity. The magnet assembly inside each target is configured to provide a magnetic field racetrack over the outer surface of each tubular target, the magnetic field racetrack confining a plasma gas to erode the target material of each target to create a combined area of target material flux for each tubular target, wherein a greater fraction of the target flux from each target is utilized to deposit target material on the substrate than from a single zone on each target. The magnet assemblies are oriented relative to each other such that, at the substrate, an included angle is formed between a pair of planes passing through the axis of each target, and the target flux of each of the targets combines to create an area of substantially uniform flux at the substrate.

Each of the methods previously described suffers from one or more of the problems commonly associated with reactive sputtering. What is needed is an improved sputtering apparatus and control process for high rate deposition of insulating and semiconducting films that provides uniform coatings. Film stoichiometry must be kept uniform throughout the thickness of the film. Additionally, the process must provide a uniform coating thickness.

SUMMARY OF THE INVENTION

The present invention provides, in embodiments, an alternative apparatus and alternative process for coating substrates with metallic, dielectric or semiconducting films.

The present invention provides in an embodiment a deposition process that is stable and that can be accurately controlled over extended periods of operation of the apparatus.

In some embodiments the present invention provides an apparatus and process that produces dielectric and semiconducting films with controlled and uniform stoichiometry. In accordance with one aspect of the present invention the deposition apparatus comprises at least one set of dual rotatable cylindrical sputtering targets mounted in a vacuum chamber. Baffles, shielding, a vacuum pump (or pumps), and appropriate valving which together constitute a semi-isolated sputtering enclosure or module can also be provided.

Magnet assemblies are provided in the hollow target cylinders to provide erosion zones running long the parallel sides of a racetrack. The parallel sides of each racetrack act as target flux sources towards a substrate. These parallel erosion zones have a highly concentrated plasma density for rapid sputtering of the target and any reactive material. They can enable sputtering at low pressures, which yields films formed at higher average energy per deposited atom. Aspects of the present invention are one or more of: the angular distance between normals to adjacent parallel erosion zones, this angle being greater than 45° subtended at the centre of the cylindrical target, the placement of the substrate with respect to the targets, and the pointing angles (orientation or tilt) of the racetracks toward the substrate and/or each other. These parameters are optimized to form a relatively wide and efficient constant flux deposition region at the substrate. This allows high deposition rates at constant reactive gas partial pressures with substantially uniform film stoichiometry and thickness. Typical parameters can be: the target to substrate distance is between 50 and 500 mm, one magnet assembly can be oriented (tilted) with respect to a plane perpendicular to the substrate to subtend an angle of between 5° and 40°, the spacing of the axes of the at least first and second targets is between 40 and 500 mm, the diameter of the cylindrical targets is between 30 and 500 mm.

The result is that the target flux at the substrate is substantially constant with a variability of less than 5%, preferably with a variability of less than 2% more preferably with a variability of less than 1% over a distance of at least 75% of the spacing distance between the axes of the outer magnetrons and more preferably over a distance similar (+/−20%) to the spacing distance between the axes of the outer magnetrons.

The rotatable cylindrical targets can be cooled by a cooling medium such as cooling water to allow sputtering at higher energy densities and higher deposition rates.

Reactive sputtering can be conveniently accomplished by using the apparatus and methods of the present invention.

Embodiments of the present invention can solve the problem of prior art sputtering equipment and processes which fail to provide an economical and workable solution for obtaining controllable high rate deposition of insulating and semiconducting films with substantially uniform coating thickness and composition.

Another aspect the present invention provides a vacuum sputtering system for eroding and depositing target material on a substrate, comprising at least a first and a second cylindrical tubular target, each having a longitudinal axis and an outside surface and a fixed length, each of the at least first and second cylindrical tubular targets being rotatable about the longitudinal axis of the cylindrical tubular target, wherein the second rotatable cylindrical tubular target is positioned relative to the first target such that axes of the at least first and second targets are parallel to each other. At least a first and a second magnet assembly respectively are disposed within and along the length of the at least first and the second tubular targets, each magnet assembly being configured to provide a magnetic field racetrack over the outer surface of each tubular target, the magnetic field racetrack confining a plasma gas to erode the target material of each target from a pair of substantially parallel erosion zones along the length of the each tubular target. Each pair of erosion zones defines a source plane for each target and is separated by a distance therebetween, and each magnet assembly is configured to fix the distance between the parallel erosion zones in each target to create a combined area of target material flux for each tubular target. A normal to the source plane passing through the centre of a target defines a first reference plane. The magnet assemblies are oriented relative to each other such that an included angle is formed between a pair of second reference planes passing through the axis of each target. These second reference planes, each of which passes through the centre of a tubular target and also through the centre of an erosion zone of the same target subtend an angle at the centre of that tubular target greater than 45°, e.g. between 45 and 90°.

In an embodiment the vacuum sputtering system further comprising means for placing the substrate with respect to the targets, wherein a pair of first reference planes the from different targets do not intersect at the side of the substrate containing the targets. For example they may intersect at the side of the substrate away from the targets or they may be parallel, i.e. they do not intersect.

Such an arrangement has the advantage that a broad uniform area of target flux can be obtained on the substrate. This can result in a greater uniformity of the coating and better stoichometric characteristics. To achieve this the target flux of each of the targets combines to create an area of substantially uniform flux at the substrate.

In embodiments the angle subtended at the centre is between 50° and 80°. This selection of angles can optimise the broad uniform area of target flux can be obtained on the substrate.

The target to substrate distance is preferably between 50 and 500 mm. These spacing allow a stable sputtering of the coating on the substrate.

The outer magnet assemblies are preferably oriented with respect to a plane perpendicular to the substrate to subtend an angle of between 5° and 40°. The rotation of the magnet assemblies e.g. towards each other directs the target flux towards a common area of the substrate.

The spacing of the axes of the at least first and second targets can be between 40 and 500 mm. This range of distances is such that a combined flux can be obtained at the substrate.

The diameter of the cylindrical targets can be, for example, between 30 and 500 mm. This range of diameters allows standard target tubes to be used.

The target flux at the substrate is set preferably so that it is substantially constant with a variability of less than 5%, preferably with a variability of less than 2% more preferably with a variability of less than 1% over a distance of at least 75% of the spacing distance between the axes of the outer magnetrons and more preferably over a distance similar (+/−20%) to the spacing distance between the axes of the outer magnetrons.

Close control of the target flux helps to improve coating quality and uniformity.

The arrangement may be configured such that two planes normal to the source planes intersect in a line common to both planes; and the substrate is positioned at a distance nearer to the targets than the intersecting line.

This allows the separation of the two or more skewed Gaussian target fluxes on the substrate so as to generate a larger region of uniform flux.

In another aspect the present invention provides a method of vacuum sputtering for the erosion and deposition of a target material on a substrate using at least a first and a second cylindrical tubular target, each having a longitudinal axis and an outside surface and a fixed length, each of the at least first and second cylindrical tubular targets being rotatable about the longitudinal axis of the cylindrical tubular target, and at least a first and a second magnet assembly respectively disposed within and along the length of the at least first and the second tubular targets, each magnet assembly configured to provide a magnetic field racetrack over the outer surface of each tubular target, the method comprising:

positioning the second rotatable cylindrical tubular target relative to the first target such that axes of the at least first and second targets are parallel to each other;

eroding the target material of each target from a pair of substantially parallel erosion zones along the length of the each tubular target, each pair of erosion zones defining a source plane for each target and being separated by a distance there between, and each magnet assembly configured to fix the distance between the parallel erosion zones in each target to create a combined area of target material flux for each tubular target, (a normal to the source planes that passes through the centre of a target defining a first reference plane) orienting the magnet assemblies relative to each other and positioning the targets relative to the substrate such that an included angle is formed between a pair of second reference planes at the axis of each target, wherein the second reference planes, each of which passes through the centre of a tubular target and also passes through the centre of an erosion zone of that same tubular target subtend an angle at the centre of that target of between 45 and 90°.

The method can include placing the substrate with respect to the targets, wherein the pair of first reference planes from different targets do not intersect at the side of the substrate containing the targets. For example they may intersect at the side of the substrate away from the targets or they may be parallel, i.e. they do not intersect.

The method can include combining the target flux of each of the targets to create an area of substantially uniform flux at the substrate.

The method can include setting the angle subtended at the centre between 50° and 80°.

The method can also include orienting the outer magnet assemblies with respect to a plane perpendicular to the substrate to subtend an angle of between 5° and 40°.

Preferably the target flux at the substrate is set so that it is substantially constant with a variability of less than 5%, preferably with a variability of less than 2% more preferably with a variability of less than 1% over a distance of at least 75% of the spacing distance between the axes of the outer magnetrons and more preferably over a distance similar (+/−20%) to the spacing distance between the axes of the outer magnetrons.

The sputtering may be carried out such that the two planes normal to the source planes intersect in a line common to both planes; and the substrate is positioned at a distance nearer to the targets than the intersecting line.

BRIEF DESCRIPTION OF THE DRAWINGS

These and other features, aspects and advantages of the present invention will become better understood with regard to the following description, appended claims, and accompanying drawings where:

DETAILED DESCRIPTION OF EMBODIMENTS OF THE INVENTION

Figure 1A:
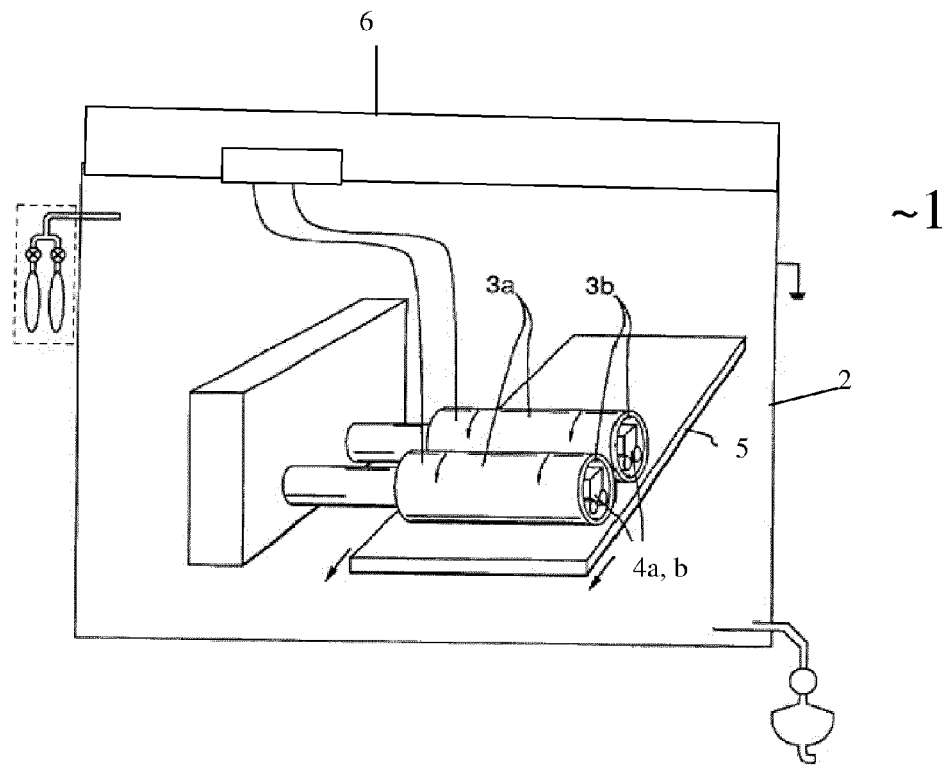
FIG. 1a shows a schematic diagram of a vacuum sputtering system that can be used with the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The present invention relates to coating systems and processes that utilize improved magnetrons as hereafter described. In a dual magnetron configuration, and, likewise, in a triple magnetron configuration, two magnetrons or three magnetrons, are mounted together substantially in parallel. More than three magnetrons can be used with the present invention. Minor differences in dimensions or design details would not negate their ability to properly function together.

FIG. 1a is a schematic diagram of a vacuum sputtering system 1 of the kind that can be used with the present invention. The magnetron system is for eroding and depositing target material onto a substrate 5. For example, the sputtering may be onto thin film transistors (FPD) for thin film electronics, onto solar absorbers (PV), onto flexible metallic or polymeric substrates, or onto glass substrates. For example, the sputtering may be for deposition of oxide layers by a low pressure plasma process at low temperatures in layers for which providing electronic functionality raises the problem of plasma damage of the growing film due to unwanted interaction of fast species with the growing film. This is a problem for semiconductor applications such as processing layers in the nanoscale range for Thin Film Transistor applications or in current spreading layers for LED in optoelectronics and for oxide based p-n junctions.

Certain parts of a sputtering magnetron system 1 will not be described in detail such as vacuum feedthroughs, rotating mechanisms, target support means, plasma and/or argon gas feeds and control systems, power supply and control therefore, and the cooling system (normally using water) and control therefore. The sputtering chamber 2 has a cathode lid 6 and a plurality of horizontally mounted rotatable cylindrical targets 3a, 3b . . . , e.g. typically two such cylindrical targets 3a, 3b. The tubular target 3a, 3b may be machined from a relatively thick wall tube, or it may consist of target layer fixed onto a carrier tube. Both tubular target layer and the backing tube may rotate when sputtering takes place. Hence means for rotating the targets are provided such as one or more motors. Inside each of the hollow tubular targets 3a, 3b are positioned magnet assemblies 4a, 4b that remain stationary as the cylindrical targets are rotated. Magnet assemblies 4a, 4b create plasma racetracks immediately above the target surface when in operation and the racetracks result in erosion zones on the surfaces of the tubular targets. The magnet assemblies include magnets, e.g. lines of magnets of one polarity parallel to the longitudinal axis of the tubular target. Each magnet assembly is configured to provide a magnetic field racetrack over the outer surface of each tubular target. In operation, the magnetic field racetrack confines a plasma gas to erode the target material of each target from a pair of substantially parallel erosion zones along the length of the each tubular target, each pair of erosion zones defining a source plane for each target and being separated by a distance there between, and each magnet assembly configured to fix the distance between the parallel erosion zones in each target to create a combined area of target material flux for each tubular target. Preferably a greater fraction of the target flux from each target is utilized to deposit target material onto a substrate 5 than from a single zone on each target. The magnet assemblies 4 are rotated or tilted relative to the plane of the substrate in opposing directions. Accordingly there are means for tilting the magnet assemblies. This can be done by hand and locked in position by a locking mechanism and optionally a fine adjustment system, or the tilting may be done by a motor such as a stepping motor or a servomotor with angular position feedback control. The magnet assemblies 4 are oriented relative to each other such that, at the substrate, the target flux of each of the targets combines to create an area of substantially uniform flux at the substrate 5. The angular distance ("racetrack angle") between the parallel erosion zones, subtended at the centre of the cylindrical target is preferably greater than 45°, for example is 45 to 90° or for example 50 to 80°. The placement of the substrate with respect to the targets, and the pointing angles of the racetracks toward the substrate and each other are selected to create a uniform target flux over a significant area at the substrate. These parameters are optimized to form a relatively wide and efficient constant flux deposition region at the substrate. This allows high deposition rates at constant reactive gas partial pressures with substantially uniform film stoichiometry and thickness. For example, the target to substrate distance can be between 50 and 500 mm. For example, one magnet assembly can be oriented with respect to a plane perpendicular to the substrate to subtend an angle of between 5° and 40°. For example, the spacing of the axes of the at least first and second targets can be between 40 and 500 mm. For example, the diameter of the cylindrical targets can be between 30 and 500 mm.

In accordance with embodiments of the present invention the target flux at the substrate is substantially constant with a variability of less than 5%, preferably with a variability of less than 2% more preferably with a variability of less than 1% over a distance of at least 75% of the spacing distance between the axes of the targets of the outermost magnetrons and more preferably over a distance similar (+/−20%) to the spacing distance between the axes of the outermost magnetrons.

The tubular target includes a target support assembly for holding the target material and for enabling the target material to be rotated with respect to the magnet assembly. Means are provided to rotate the tubular target at a determinable speed. Means are provided for introducing a plasma gas into the sputtering chamber and controlling the gas flow to achieve a determinable density of the plasma gas in the vicinity of the substrate. Means can be provided for introducing a reactive gas into the sputtering chamber and controlling the gas flow to achieve a determinable density of the plasma gas in the vicinity of the substrate. The speed of rotation of the targets and the density of the plasma gas at the erosion zones is preferably set to prevent target material from accumulating on the target at a location away from the erosion zones during a rotation of the tubular target.

The present invention may also include the use of one or more shields to facilitate the removal of target material that did not arrive onto the substrate. In DC operation a separate electrical anode, constructed from a conducting material, usually a metal, may be foreseen.

Figure 2B:
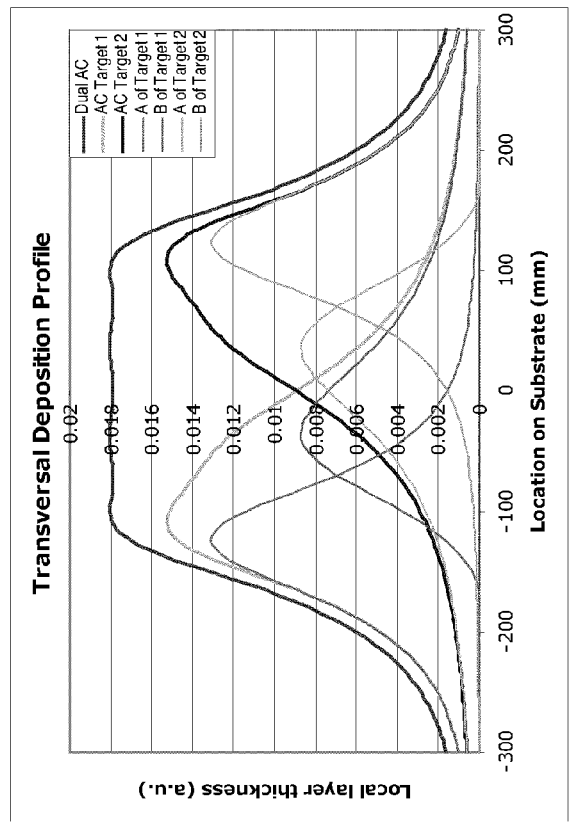
FIG. 2b shows a graphical representation of target flux at the substrate for a rotatable cylindrical magnetron arrangement according to an embodiment of the present invention.
Figure 3:
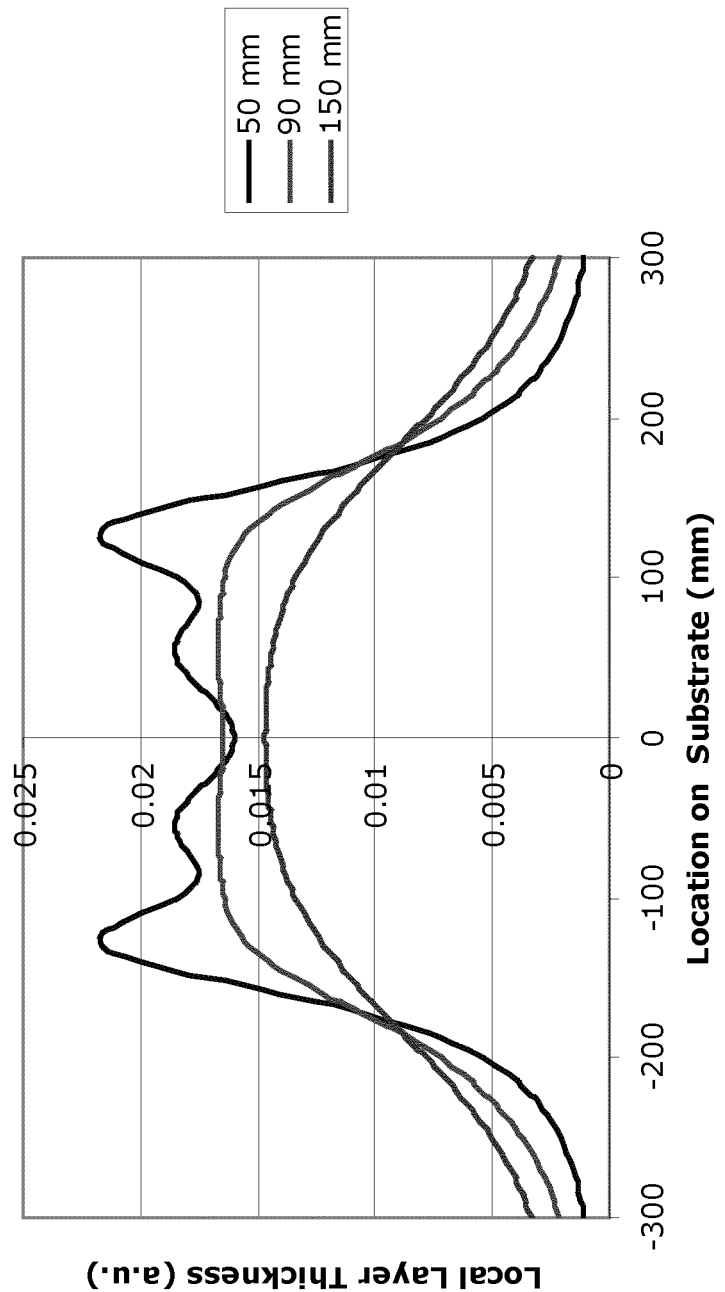
FIG. 3 shows a graphical representation of target flux at the substrate for a rotatable cylindrical magnetron arrangement having a pronounced ripple.

In an embodiment, each pair of erosion zones on a target defines a source plane and planes normal to the source planes in the direction of the substrate intersect with the substrate in such a way that the intersections of the normals to the source planes define first reference planes which intersect with the substrate such that the intersections are spaced along the substrate along the moving direction of the substrate. Hence inn some embodiments, the substrate is positioned such that a line of intersection that is common to both first reference planes normal to the source planes, is well behind the substrate, i.e. on the opposite side of the substrate from the targets. Hence the substrate is positioned at a distance nearer to the targets than this intersecting line. Alternatively the two first reference planes may be parallel to each other. This geometrical arrangement results in a combination of both fluxes from the targets that has a broad area where the flux is constant (see FIGS. 2B, 4 and 5). If the substrate is placed too close to the targets the peaks of flux from the targets become separated on the substrate. Hence a ripple appears within the uniform flux (see FIG. 3). This ripple can be defined by a Peak-to-Peak value that is defined by dividing the maximum local deposition rate minus the minimum local deposition rate by the average deposition rate within the substrate window of substantially constant flux. The variability is defined by dividing the Peak-to-Peak value by 2. If the substrate is too far from the targets the peaks merge but are wider in extent. A target flux from a single erosion zone that is oriented with respect to the substrate typically has a distribution similar to a skewed Gaussian-like curve having a center of distribution and a width (see FIG. 2b). The width of the Gaussian-like curve can be defined as a distance between two one-half points on the curve. The distance between the parallel erosion zones on each target is set so that the target flux at the substrate from the pair of erosion zones is substantially uniform over a field larger than that from a single erosion zone.

Figure 1B:
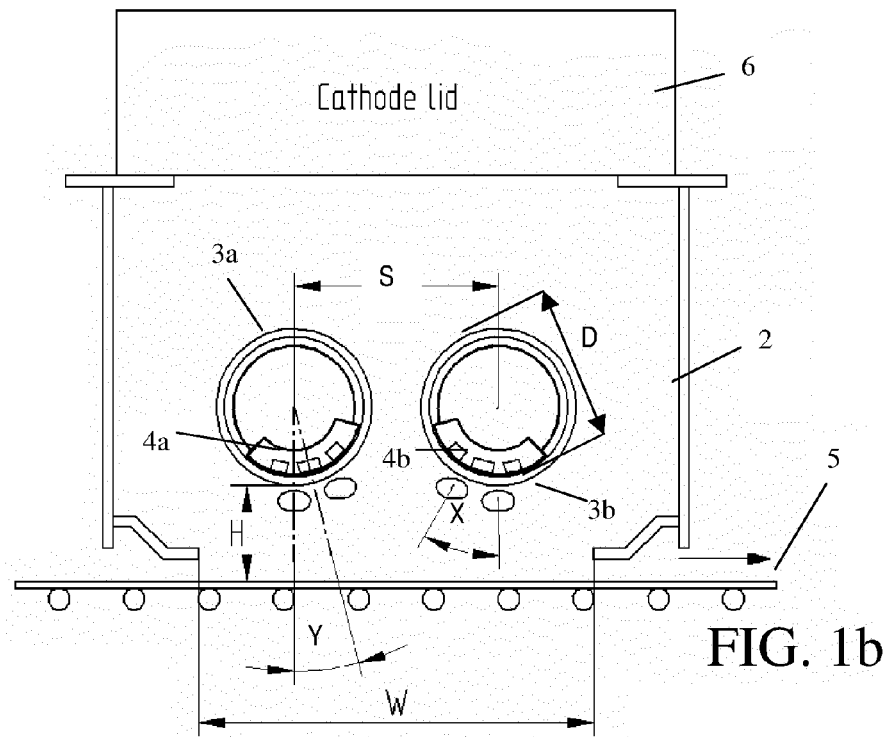
FIG. 1b shows a cross-sectional view of the cylindrical magnetrons in accordance with an embodiment of the present invention.

Returning to FIG. 1b, this is a schematic cross-sectional diagram of the magnet assemblies 4a, 4b inside tubular targets 3a, 3b. In embodiments of the present invention the magnet assembly is fixed with respect to a substrate position. Typically, the substrate 5 is moved continuously below the cylindrical targets 3a, 3b. In a preferred embodiment the movement is perpendicular or substantially perpendicular to the longitudinal axes of the cylindrical targets but the present invention is not limited thereto. The second rotatable cylindrical tubular target 3b is positioned relative to the first target 3a such that axes of the first and second targets 3a, 3b are parallel to each other and the outside surfaces of the first and second cylindrical tubular targets 3a, 3b are in close proximity.

Figure 4:
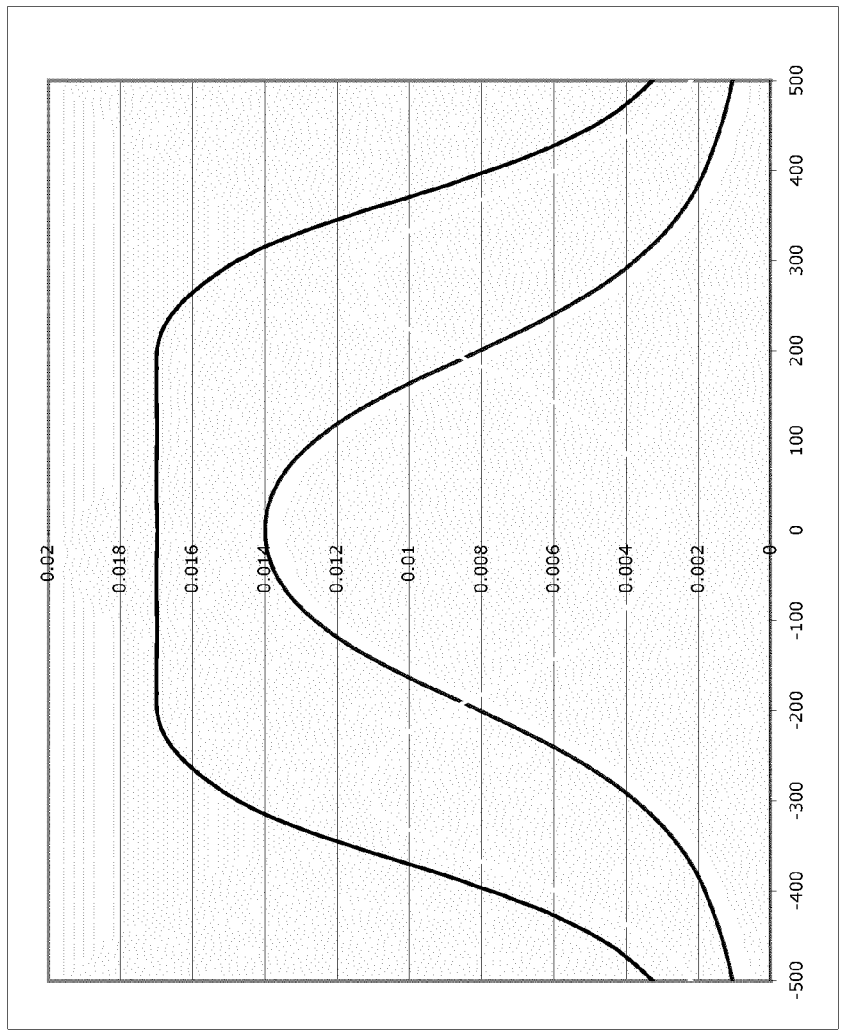
FIG. 4 shows a graphical representation of target flux at the substrate for a rotatable cylindrical magnetron arrangement according to yet another embodiment of the present invention.
Figure 5:
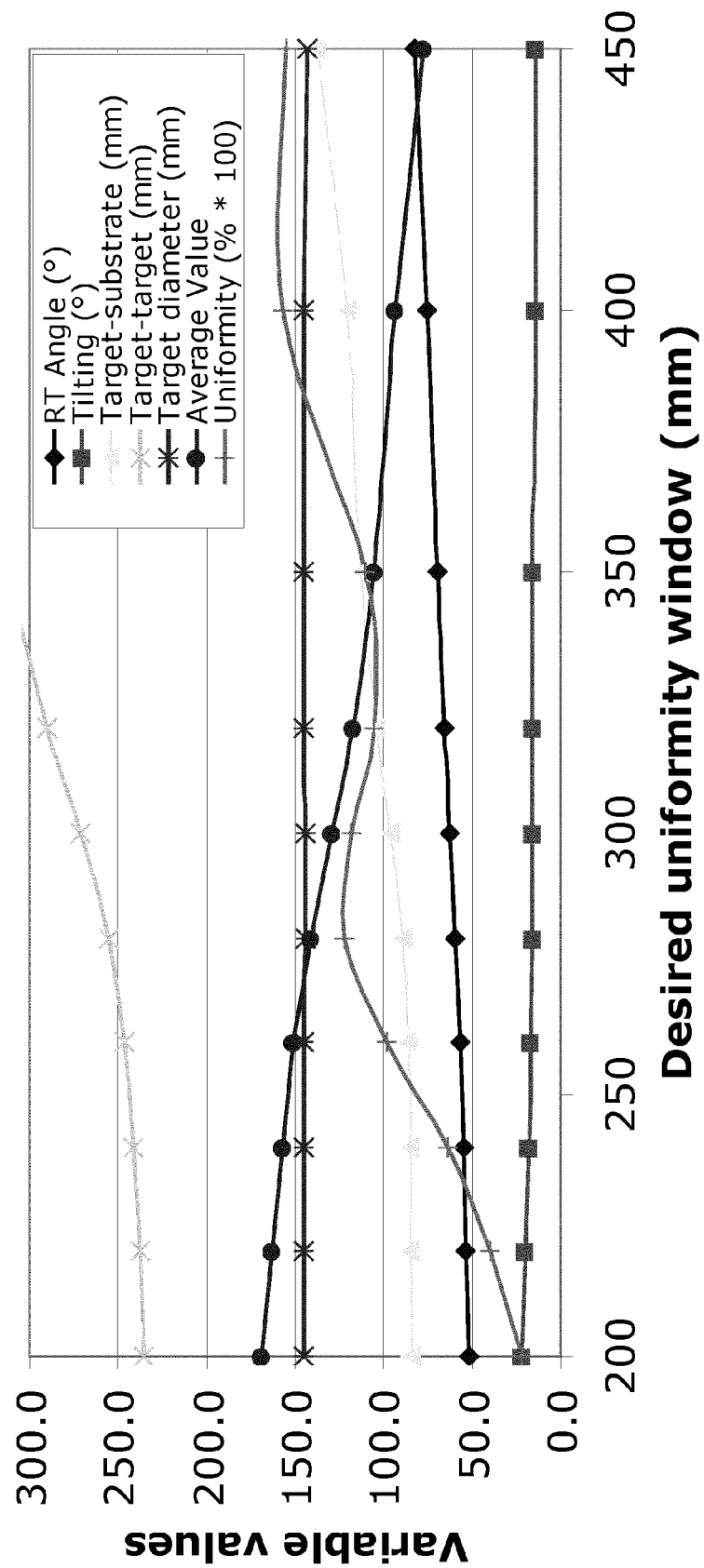
FIG. 5 shows optimisations of parameters according to embodiments of the present invention.

All of the magnets of the magnet assemblies 4a, 4b point radially away from the geometrical centers of the respective tubular targets 3a, 3b. Distance "S" between the targets 3a, 3b, target-substrate spacing H, the angle between racetracks "X" and the rotation or tilting of the magnet assemblies with respect to each other, "Y", are selected so that the target flux of the targets combines to create an area of substantially uniform flux at the substrate 5 and hence of uniform thickness and stoichiometry. This is achieved by spreading the sputtered material flux evenly, and by reducing hot zones on the substrate. As shown in FIGS. 4 and 5 this geometrical arrangement causes the sputtered flux to be uniform across a significant portion of the deposition region at the substrate. The magnetron cross-sections of the targets 3a and 3b are identical except for their orientation. Each magnet assembly 4 can include a support structure constructed from a water resistant magnetic alloy. Each magnet assembly includes center and outer magnets arranged so that erosion zones are produced on the target which subtend an angle (the race track angle X) between 45 and 90° or between 50 and 80° at the centre of the cylindrical target. This means that there exist second reference planes, each of which passes through the centre of a target and through the centre of an erosion zone of that target and which subtend an angle of greater than 45°, e.g. between 45 and 90° or 50 and 80°. The magnets may have magnet pole pieces. Pole pieces aid in smoothing out the magnetic field produced by magnets if they are constructed from an array of smaller individual magnets. The magnets may be arranged in a housing to prevent exposure to the cooling medium. The directions of magnetization of magnets may be selected as desired, however, all the magnet assemblies that are used in a given system usually have like magnetic orientation. The cross section shape of the magnets may be rectangular or may have irregular shape as to accommodate the desired magnetic field distribution. The magnets may be of the rare earth (NeFeB) type, which have very high energy density. They define the erosion zones that are part of the racetrack. The magnet assemblies 4 are intentionally constructed to increase the distance between the center and outer magnets compared to prior art designs, to thereby produce erosion zones spaced at large distances while maintaining high magnetic field strength.

The vacuum sputtering system according to the present invention can be used for high rate reactive deposition of, for example, dielectric thin films at low sputtering gas pressure with both conductive and insulating target materials. This allows the apparatus to produce superior quality dielectric films while maintaining a very constant process over the lifetime of the target tube.

Figure 2A:
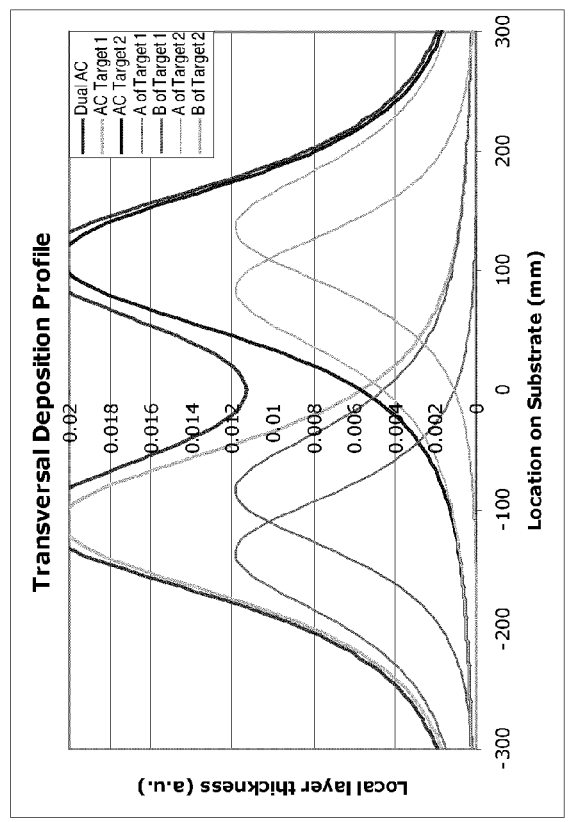
FIG. 2a shows a graphical representation of target flux at the substrate for a conventional rotatable cylindrical magnetron arrangement.

FIG. 2a illustrates schematically the relative distribution of sputtered flux from two erosion zones on the substrate according to a conventional arrangement. The sputtered flux distribution has the approximate shape of superimposed skewed Gaussian curves. The central flux is lower than the peaks on either side and the coating produced may vary in content and thickness. The configuration used was: Diameter of target D: 150 mm, Target-substrate spacing H: 80 mm, Spacing of target axis S: 220 mm Race track angle X: 30°, Tilting of race-track Y: 0°. The results shown graphically in FIG. 2A were: Peak-to-Peak variation within 220 mm length of surface on the substrate in the movement direction was: 62% and a yield within a 400 mm window: 84%. The zone of uniform sputtered flux is taken the same as the axis spacing of the magnetrons.

FIG. 2b illustrates schematically the relative distribution of sputtered flux from two erosion zones on the substrate in accordance with embodiments of the present invention. The configuration was as follows: Diameter of target D 147 mm, Target-substrate spacing H: 76 mm, Spacing of target axis S: 223 mm, Race track angle X: 50°, Tilting of race-track Y: 18°. The results are shown graphically in FIG. 2b and were Peak-to-Peak variation within length of 220 mm in movement direction: <1%, Yield within 400 mm window: 85%. The zone of uniform sputtered flux is taken the same as the axis spacing of the magnetrons. The sputtered flux distribution has the approximate shape of a "pork pie hat". There is a significant area of constant central flux the coating produced is more uniform in content and thickness. With such an arrangement and a constant partial pressure of reactive gas a deposited film on the substrate that has a substantially uniform stoichiometry and thickness. The Gaussian-like flux distribution of the second sputtering erosion zone is added to the first. This alignment of the two distributions yields a relatively broad and uniform flux distribution at the substrate.

FIG. 4 relates to an arrangement according to an embodiment of the present invention with four targets and hence 4 racetracks and 8 erosion zones. The central curve is the resulting material flux of the inner two targets and the bimodal curve is the resulting material flux of the outer two targets. The top curve with flat zone is the resulting material flux of all 4 targets. In this case it is necessary to balance power of the magnetrons in the middle compared to the magnetrons on the outside. The inner magnetrons (i.e. not the outer magnetron at each side) can have similar power level and there is no tilting of the magnet bar with respect to the substrate. This means the source plane is parallel with the substrate. The race track angles can be similar for these magnetrons and a similar spacing between the targets and may have similar spacing to the substrate. The outer magnetrons (i.e. 1 target at each side) may have slightly higher power level, may have inward tilting of the magnet bar, may have slightly smaller spacing to the substrate. An example of a configuration is: racetrack angle for all targets X: 54°, tilting of the outer magnetrons (each inwards): 6°, target diameter D: 150 mm, target-target spacing S: 190 mm, number of magnetron sets: 2, power level per magnetron: first: 100%, second 100%, target-substrate spacing H: first: 149 mm, second 121 mm. The results are shown schematically in FIG. 4 and are: uniformity min: 99%, max. 100.1%, Peak-to-Peak variation 0.2%. Optionally, all targets can be placed so that they have the same target-substrate spacing and the coating uniformity can be controlled by setting the power level in the outer magnetrons.

FIG. 5 shows an optimisation of parameters according to embodiments of the present invention. All the points on the graphs relate to a uniform sputter zone perpendicular to target axis depending on the criteria:
  Uniform zone (+/−1%) from 100 mm to 450 mm with one dual configuration
  Constraints on spacings (between targets and substrate) and angles
  Simulating change in target diameter and target-substrate spacing over target lifetime
  Sensitivity analysis on each variable.

As can be seen from FIG. 5 good results are obtained for uniformity when the racetrack angle is in the range 45 to 90°, especially 50 to 80°.

The sputtering process is preferably also stabilized and controlled by fixing parameters such as pumping speed, plasma (i.e. sputtering) gas flow, reactive gas flow, power supply voltage, substrate speed all of which are simply held constant during deposition.

The embodiments described above use a racetrack angle of above 45° and the examples show that a higher sputter rate is obtained with better uniformity. The reactive gas partial pressure can be reduced to react fully at the location where the largest flux of target particles is arriving. Further, at this working point; the target is less poisoned and may realize a higher sputter rate for the same power level. Also with reference to the homogeneous layer composition, the compound formation is much more homogeneous over the formed layer thickness. Thus higher performing TCO's may be realized with the same target materials. Hence, the compound formation is not different depending on the local flux of target particles arriving at the substrate. Also it is less necessary for TCO's to make a trade-off between conductivity and layer transmittance.

Although the present invention has been described in considerable detail with reference to certain preferred versions thereof, other versions are possible. Therefore, the spirit and scope of the appended claims should not be limited to the description of the preferred versions.

The invention claimed is:

1. A vacuum sputtering system for eroding and depositing target material on a substrate, the system comprising:
   at least a first and a second cylindrical tubular target, each target having a longitudinal axis, an outside surface and a fixed length, each of the at least first and second cylindrical tubular targets being rotatable about the longitudinal axis of the cylindrical tubular target, wherein the second rotatable cylindrical tubular target is positioned relative to the first target such that axes of the at least first and second targets are parallel to each other; and
   at least a first and a second magnet assembly respectively disposed within and along the length of the at least first and the second tubular targets, each magnet assembly configured to provide a magnetic field racetrack over the outside surface of each tubular target, the magnetic field racetrack confining a plasma gas to erode target material of each target from a pair of substantially parallel erosion zones along a length of each tubular target, each pair of erosion zones defining a source plane for each target and being separated by a distance there between;
   wherein each magnet assembly is configured to fix the distance between the parallel erosion zones in each target to create a combined area of target material flux for each tubular target,
   wherein the magnet assemblies are oriented relative to each other such that an included angle is formed between a pair of reference planes passing through the longitudinal axis of each target, and
   wherein the reference planes, each of which passes through the center of a tubular target and through the center of an erosion zone of that target, subtend an angle at the center of that target of between 45 and 90°.

2. The vacuum sputtering system of claim 1, wherein the substrate is located with respect to the targets so that a pair of planes perpendicular to the source planes that pass through the center of different targets do not intersect at a side of the substrate facing the targets.

3. The vacuum sputtering system of claim 2, wherein the racetracks have pointing angles towards the substrate and towards each other and wherein the angular distance between the normals to the parallel erosion zones in each target, the placement of the substrate with respect to the targets, and the pointing angles of the racetracks are such that the target flux of each of the targets combines to create an area of substantially uniform flux at the substrate.

4. The vacuum sputtering system of claim 3, wherein the target flux at the substrate is substantially constant with a variability of less than 5% over a distance of at least 75% of the spacing distance between the axes of outermost targets.

5. The vacuum sputtering system of claim 1, wherein the angle subtended at the center is between 50° and 80°.

6. The vacuum sputtering system of claim 1, wherein the target to substrate distance is between 50 and 500 mm.

7. The vacuum sputtering system of claim 1, further wherein said magnet assemblies include outer magnet assemblies, said outer magnet assemblies being oriented with respect to a plane perpendicular to the substrate to subtend an angle of between 5° and 40°.

8. The vacuum sputtering system of claim 1, wherein the spacing of the axes of the at least first and second targets is between 40 and 500 mm.

9. The vacuum sputtering system of claim 1, wherein the diameter of the cylindrical targets is between 30 and 500 mm.

10. The vacuum sputtering system of claim 2, wherein the pair of planes intersect at a line common to both planes; and wherein the substrate is positioned at a distance nearer to the targets than the intersecting line.

11. A method of vacuum sputtering for the erosion and deposition of a target material on a substrate using at least a first and a second cylindrical tubular target, each having a longitudinal axis, an outside surface and a fixed length, each of the at least first and second cylindrical tubular targets being rotatable about the longitudinal axis of the cylindrical tubular target, and at least a first and a second magnet assembly respectively disposed within and along the length of the at least first and the second tubular targets, each magnet assembly configured to provide a magnetic field racetrack over the outer surface of each tubular target, the method comprising the steps:

positioning the second rotatable cylindrical tubular target relative to the first target such that axes of the at least first and second targets are parallel to each other;

eroding the target material of each target from a pair of substantially parallel erosion zones along the length of the each tubular target, each pair of erosion zones defining a source plane for each target and being separated by a distance there between, wherein each magnet assembly is configured to fix the distance between the parallel erosion zones in each target to create a combined area of target material flux for each tubular target; and orienting the magnet assemblies relative to each other and positioning the targets relative to the substrate such that an included angle is formed between a pair of reference planes passing through the longitudinal axis of each target, wherein the reference planes, each of which passes through the center of a tubular target and through the center of an erosion zone of that target, subtend an angle at the center of that target of between 45 and 90°.

12. The method of claim 11, further comprising placing the substrate with respect to the targets so that a pair of planes perpendicular to the source planes that pass through the center of different targets do not intersect on the side of the substrate containing the targets.

13. The method of claim 11, wherein the angle subtended at the center is between 50° and 80°.

14. The method of claim 11, further comprising orienting outer magnet assemblies of said magnet assemblies with respect to a plane perpendicular to the substrate to subtend an angle of between 5° and 40°.

15. The method of claim 12, further comprising setting the angular distance between the normals to the parallel erosion zones in each target, the placement of the substrate with respect to the targets, and pointing angles of the racetracks towards the substrate and towards each other such that the target flux of each of the targets combines to create an area of substantially uniform flux at the substrate.

16. The method of claim 15, wherein the target flux at the substrate is set so that it is substantially constant with a variability of less than 5% over a distance of at least 75% of the spacing distance between the axes of outermost targets.

17. The method of claim 12, wherein the pair of planes intersect in a line common to both planes; and wherein the substrate is positioned at a distance nearer to the targets than the intersecting line.

* * * * *